(12) United States Patent
Osanai (10) Patent No.: US 8,745,841 B2
(45) Date of Patent: Jun. 10, 2014

(54) ALUMINUM BONDING MEMBER AND METHOD FOR PRODUCING SAME

(75) Inventor: Hideyo Osanai, Shiojiri (JP)

(73) Assignee: Dowa Metaltech Co., Ltd., Tokyo (JP)

( * ) Notice: Subject to any disclaimer, the term of this patent is extended or adjusted under 35 U.S.C. 154(b) by 0 days.

(21) Appl. No.: 13/404,233

(22) Filed: Feb. 24, 2012

(65) Prior Publication Data
US 2012/0152482 A1    Jun. 21, 2012

Related U.S. Application Data

(62) Division of application No. 11/096,301, filed on Mar. 31, 2005, now abandoned.

(30) Foreign Application Priority Data

Mar. 31, 2004 (JP) ................................. 2004-103164
Jul. 27, 2004 (JP) ................................. 2004-218526

(51) Int. Cl.
*B23P 25/00* (2006.01)
(52) U.S. Cl.
USPC .......... 29/458; 29/527.1; 29/527.2; 29/527.3; 29/830; 29/832; 164/112
(58) Field of Classification Search
USPC ............ 29/527.1–527.3, 527.5, 458, 890.03, 29/890.054, 530, 830, 832; 164/91, 98, 164/112, 137; 228/121–123.1, 180.1, 228/180.21, 256–262; 174/250–265
See application file for complete search history.

(56) References Cited

U.S. PATENT DOCUMENTS

| | | | | |
|---|---|---|---|---|
| 3,766,440 A | * | 10/1973 | Baird | 361/708 |
| 4,161,980 A | * | 7/1979 | Ruger | 165/168 |
| 4,196,775 A | * | 4/1980 | Groh | 165/68 |
| 4,677,724 A | * | 7/1987 | Kuroki | 228/193 |
| 4,700,273 A | * | 10/1987 | Kaufman | 361/708 |
| 4,724,514 A | * | 2/1988 | Kaufman | 361/710 |
| 4,788,627 A | * | 11/1988 | Ehlert et al. | 361/717 |
| 5,480,727 A | * | 1/1996 | Romero et al. | 428/539.5 |
| 5,533,257 A | * | 7/1996 | Romero et al. | 29/890.03 |
| 5,561,321 A | * | 10/1996 | Hirano et al. | 257/700 |
| 5,602,720 A | * | 2/1997 | Natsuhara et al. | 361/708 |
| 5,666,269 A | * | 9/1997 | Romero et al. | 361/699 |

(Continued)

FOREIGN PATENT DOCUMENTS

| | | |
|---|---|---|
| DE | 19956565 A1 | 5/2001 |
| DE | 10051338 A1 | 4/2002 |

(Continued)

*Primary Examiner* — Jermie Cozart
*Assistant Examiner* — Bayan Salone
(74) *Attorney, Agent, or Firm* — Bachman & LaPointe, P.C.

(57) ABSTRACT

There is provided an aluminum bonding member capable of being simply and inexpensively produced and capable of being used as a cooling member having a high cooling power. The aluminum bonding member 10 has an aluminum member 12 of aluminum or an aluminum alloy exposed to the outside, and a tubular member 14 of a material which does not melt at a temperature close to the melting point of aluminum or the aluminum alloy. Both of the opening end portions of the tubular member 14 are open to the outside of the aluminum member 12. A portion of the tubular member 14 between the opening end portions extends in the aluminum member 12, and the outer peripheral surface of the portion of the tubular member 14 extending in the aluminum member 12 is bonded directly to the aluminum member 12.

5 Claims, 8 Drawing Sheets

(56) References Cited

U.S. PATENT DOCUMENTS

| | | | |
|---|---|---|---|
| 5,807,626 A | 9/1998 | Naba | |
| 5,829,516 A * | 11/1998 | Lavochkin | 165/80.4 |
| 5,875,830 A * | 3/1999 | Singer et al. | 164/19 |
| 5,938,104 A * | 8/1999 | Saxelby et al. | 228/118 |
| 5,944,097 A * | 8/1999 | Gungor et al. | 165/185 |
| 6,033,787 A * | 3/2000 | Nagase et al. | 428/545 |
| 6,232,657 B1 * | 5/2001 | Komorita et al. | 257/700 |
| 6,245,442 B1 * | 6/2001 | Towata et al. | 428/614 |
| 6,257,310 B1 * | 7/2001 | Janko | 164/61 |
| 6,309,737 B1 * | 10/2001 | Hirashima et al. | 428/210 |
| 6,310,775 B1 * | 10/2001 | Nagatomo et al. | 361/707 |
| 6,424,026 B1 * | 7/2002 | Mangtani | 257/675 |
| 6,426,154 B1 * | 7/2002 | Naba et al. | 428/620 |
| 6,447,894 B1 * | 9/2002 | Hirotsuru et al. | 428/307.7 |
| 6,569,514 B2 * | 5/2003 | Naba et al. | 428/210 |
| 6,668,912 B2 * | 12/2003 | Adams et al. | 165/80.4 |
| 6,690,087 B2 * | 2/2004 | Kobayashi et al. | 257/686 |
| 6,711,017 B2 * | 3/2004 | Kurokawa et al. | 361/699 |
| 6,719,039 B2 * | 4/2004 | Calaman et al. | 165/80.4 |
| 6,911,728 B2 * | 6/2005 | Ishikawa et al. | 257/706 |
| 6,912,130 B2 * | 6/2005 | Osanai et al. | 361/699 |
| 6,938,333 B2 * | 9/2005 | Osanai et al. | 29/830 |
| 7,073,703 B2 * | 7/2006 | Takahashi et al. | 228/262.5 |
| 7,122,243 B2 * | 10/2006 | Osanai et al. | 428/210 |
| 7,131,483 B2 * | 11/2006 | Osanai et al. | 164/419 |
| 7,159,310 B2 * | 1/2007 | Osanai | 29/841 |
| 7,189,449 B2 * | 3/2007 | Osanai et al. | 428/210 |
| 7,255,931 B2 * | 8/2007 | Osanai et al. | 428/650 |
| 7,256,353 B2 * | 8/2007 | Osanai et al. | 174/252 |
| 7,276,292 B2 * | 10/2007 | Furo et al. | 428/469 |
| 7,340,828 B2 * | 3/2008 | Osanai et al. | 29/847 |
| 7,393,596 B2 * | 7/2008 | Osanai et al. | 428/650 |
| 8,011,416 B2 * | 9/2011 | Osanai et al. | 164/419 |
| 8,245,401 B2 * | 8/2012 | Lehman et al. | 29/890.054 |
| 2002/0164488 A1 * | 11/2002 | Furo et al. | 428/469 |
| 2003/0024120 A1 * | 2/2003 | Adams et al. | 29/890.03 |
| 2003/0030141 A1 * | 2/2003 | Araki et al. | 257/720 |
| 2003/0037434 A1 * | 2/2003 | Osanai et al. | 29/846 |
| 2003/0096450 A1 * | 5/2003 | Strauch | 438/106 |
| 2003/0161104 A1 * | 8/2003 | Hartzell et al. | 361/699 |
| 2004/0149689 A1 * | 8/2004 | Ning et al. | 216/83 |
| 2005/0060887 A1 * | 3/2005 | Osanai et al. | 29/847 |

FOREIGN PATENT DOCUMENTS

| | | | | |
|---|---|---|---|---|
| EP | 0676800 A2 | 10/1995 | | |
| JP | 61260660 A * | 11/1986 | | H01L 23/36 |
| JP | 2251094 A | 10/1990 | | |
| JP | 4363052 A | 12/1992 | | |
| JP | 2000208682 A | 7/2000 | | |
| JP | 2002210847 A | 7/2002 | | |
| JP | 2002-283440 | * | 9/2002 | B29C 47/92 |

* cited by examiner

ALUMINUM BONDING MEMBER AND METHOD FOR PRODUCING SAME

CROSS REFERENCE TO RELATED APPLICATION(S)

The instant application is a divisional application of co-pending U.S. patent application Ser. No. 11/096,301, filed Mar. 31, 2005, and entitled ALUMINUM BONDING MEMBER FOR PRODUCING SAME.

BACKGROUND OF THE INVENTION

1. Field of the Invention

The present invention generally relates to an aluminum bonding member and a method for producing the same. More specifically, the invention relates to an aluminum bonding member, in which a tubular member for allowing the flow of a cooling agent and which is used as a cooling member for electronic parts, such as metal/ceramic circuit boards, and a method for producing the same.

2. Description of the Prior Art

As a conventional method for mounting a cooling member, such as a radiating fin, on a metal/ceramic circuit board wherein a metal circuit plate is bonded to one side of a ceramic substrate and a radiating metal plate is bonded to the other side thereof, there is known a method for soldering one or a plurality of ceramic substrates, to each of which a metal circuit plate having a semiconductor chip soldered thereon is bonded, on a metal base plate (a radiating plate) or a composite material and for mounting a radiating fin on the reverse of the metal base plate or the like via a radiating grease. There is also known a method for bonding a radiating fin to a ceramic substrate via a brazing filler metal (see, e.g., Japanese Patent Laid-Open No. 4-363052). Moreover, there is proposed a method for integrating an electronic circuit board of a ceramic or a composite material of carbon and a metal with a cooling system using a liquid or gas as a cooling medium (see, e.g., Japanese Patent Laid-Open No. 2001-7265).

However, in the conventional method for soldering a ceramic substrate on a metal base plate, heat sink characteristics are deteriorated by the solder, and the thermal conductivity of the radiating grease used for mounting the radiating fin on the metal base plate or the like is a few W/mK which is extremely small, so that there is a problem in that the heat sink characteristics are further deteriorated. In addition, there are some cases where the yield of products may be deteriorated by solder voids. Moreover, the use of a solder containing lead (Pb) goes against a recent tendency to make Pb free in order to prevent environmental pollution.

In the method disclosed in Japanese Patent Laid-Open No. 4-363052, since an air cooling radiating fin is used, the cooling power of the radiating fin is generally lower than that of a water cooling system, so that there is a problem in that it is difficult to stabilize the performance of the radiating fin.

In the method disclosed in Japanese Patent Laid-Open No. 2001-7265, it is possible to substantially solve the above described problem on the deterioration of heat sink characteristics due to the solder and radiating grease, and the above described problem caused by the use of the radiating fin. However, it is required to dig grooves in two preform substrates of a ceramic or the like to sandwich a pipe, which is previously shaped so as to fit in the grooves, between the preform substrates to temporally fix them to put them in a die to inject a molten metal of aluminum or copper into the die to cast a cooling system at a high pressure. Therefore, costs for the die and producing apparatus are relatively high, and there are some cases where it is difficult to enhance the uniformity and working precision of the preform substrates. Moreover, since the porosity of the preform substrates is not less than 5% and is less than 50%, there are some cases where it is difficult to fill a molten metal in the preform substrates to mechanically realize the bonding by the anchor effect.

SUMMARY OF THE INVENTION

It is therefore an object of the present invention to eliminate the aforementioned problems and to provide an aluminum bonding member capable of being simply and inexpensively produced and capable of being used as a cooling member having a high cooling power, and a method for producing the same.

In order to accomplish the aforementioned and other objects, the inventors have diligently studied and found that it is possible to simply and inexpensively produce an aluminum bonding member capable of being used as a cooling member having a high cooling power, if both of the opening end portions of a tubular member of a material, which does not melt at a temperature close to the melting point of aluminum or an aluminum alloy, are caused to be open to the outside of an aluminum member of aluminum or the aluminum alloy and if the outer peripheral surface of a portion of the tubular member between the opening end portions is caused to contact the aluminum member. Thus, the inventors have made the present invention.

According one aspect of the present invention, an aluminum bonding member comprises: an aluminum member of aluminum or an aluminum alloy; and a tubular member extending in the aluminum member, both of opening end portions of the tubular member being open to the outside of the aluminum member, wherein the tubular member is made of a material which does not melt at a temperature close to a melting point of aluminum or the aluminum alloy, and at least part of an outer peripheral surface of a portion of the tubular member extending in the aluminum member contacts the aluminum member.

In this aluminum bonding member, the at least part of the outer peripheral surface of the portion of the tubular member extending in the aluminum member may contact the aluminum member to be bonded thereto. Alternatively, the whole outer peripheral surface of the portion of the tubular member extending in the aluminum member may contact the aluminum member to be bonded thereto.

In the above described aluminum bonding member, the tubular member may be made of a metal containing at least one element, which is selected from the group consisting of tungsten, molybdenum, titanium, zirconium, iron, copper and nickel, as a main component. The tubular member may be made of a ceramic or carbon. The tubular member may be made of stainless, SKD or an molybdenum alloy. The tubular member may be made of a high-melting-point sintered material. The high-melting-point sintered material may be a molybdenum sintered material or a tungsten sintered material.

In the above described aluminum bonding member, a ceramic substrate, which has a metal circuit plate bonded thereto, may be bonded to one side of the aluminum bonding member. Alternatively, ceramic substrates, each of which has a metal circuit plate bonded thereto, may be bonded to both sides of the aluminum bonding member, respectively. The aluminum bonding member may be used as a cooling member.

According to another aspect of the present invention, there is provided a method for producing an aluminum bonding member, the method comprising the steps of: preparing a tubular member of a material which does not melt at a temperature close to a melting point of aluminum or an aluminum alloy; putting the tubular member in a die so that opening end portions of the tubular member are open to the outside of the die; injecting a molten metal of aluminum or the aluminum alloy into the die; and cooling and solidifying the injected molten metal to cause a portion of the tubular member in the die to contact a solid aluminum member.

In this method for producing an aluminum bonding member, the portion of the tubular member in the die may be caused to contact the solid aluminum member to be bonded thereto. In this case, the method may further comprise a step of arranging a metal/ceramic circuit board, which has a metal circuit plate bonded to a ceramic substrate, on the die so as to close an opening portion formed in a top face of the die, before injecting the molten metal, so that the metal/ceramic circuit board contacts the solid aluminum member to be bonded thereto when the portion of the tubular member in the die is caused to contact the solid aluminum member to be bonded thereto. Alternatively, the method may further comprise a step of arranging a ceramic substrate in the die before injecting the molten metal, so that the solid aluminum member is caused to contact to one side of the ceramic substrate to be bonded thereto while an aluminum circuit plate is caused to contact the other side of the ceramic substrate to be bonded thereto when the portion of the tubular member in the die is caused to contact the solid aluminum member to be bonded thereto. In this case, the ceramic substrate may be caused to contact each of both sides of the solid aluminum member to be bonded thereto.

According to a further aspect of the present invention, there is provided a power module wherein a metal circuit plate is bonded to one side of a ceramic substrate, and the above described aluminum bonding member is bonded to the other side of the ceramic substrate.

According to the present invention, it is possible to simply and inexpensively produce an aluminum bonding member capable of being used as a cooling member having a high cooling power.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of an aluminum bonding member and a method for producing the same according to the present invention will be described below.

First Preferred Embodiment

Figure 1:
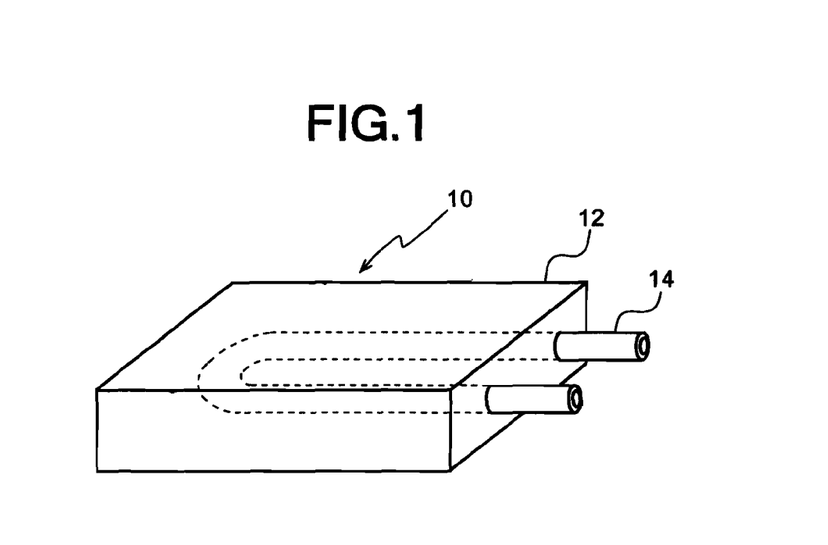
FIG. 1 is a perspective view of the first preferred embodiment of an aluminum bonding member according to the present invention.
Figure 2:
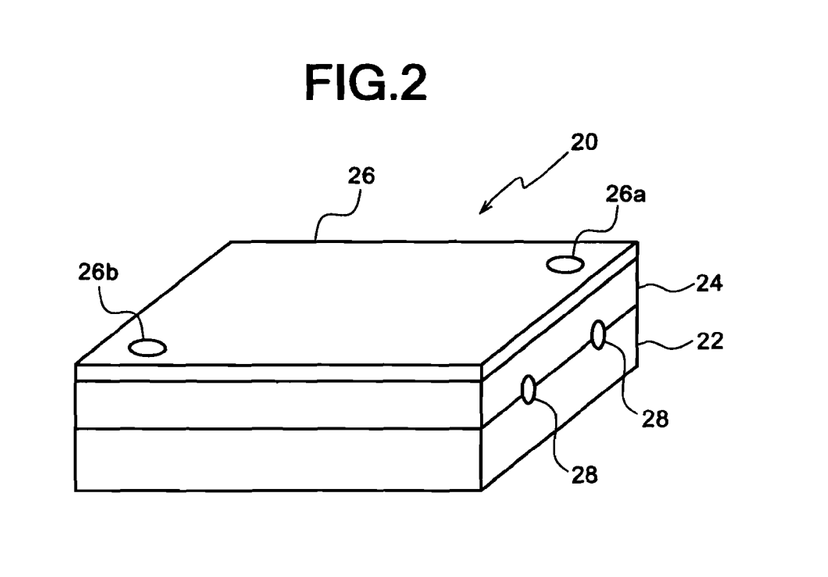
FIG. 2 is a perspective view of a die used for producing the aluminum bonding member of FIG. 1.
Figure 3:
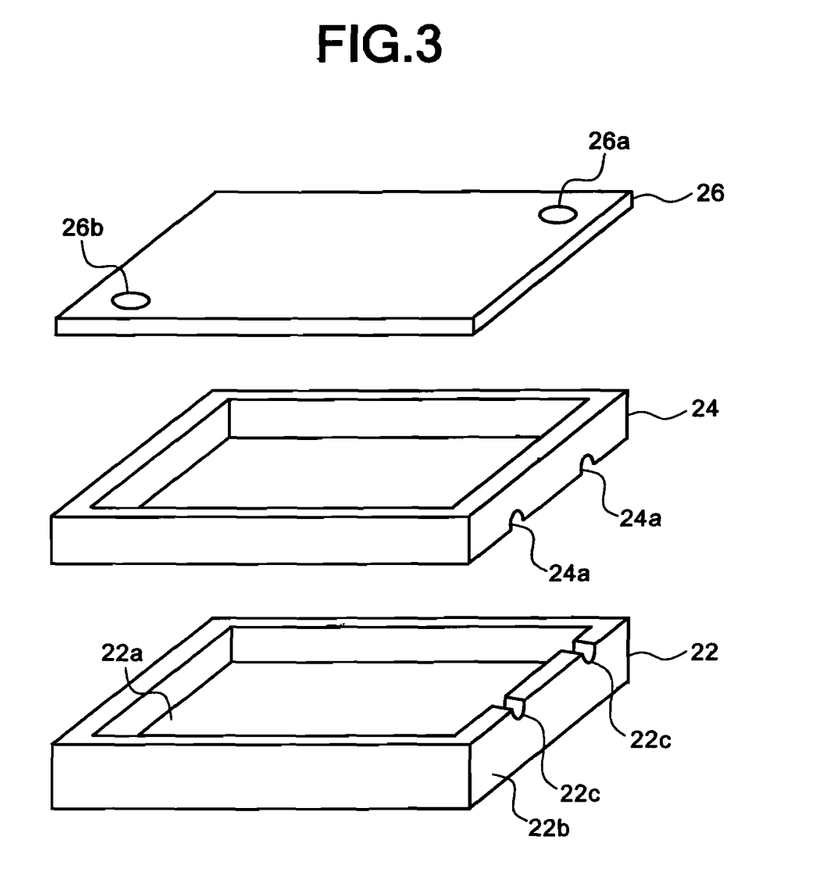
FIG. 3 is an exploded perspective view of the die of FIG. 2.

Referring to FIGS. 1 through 3, the first preferred embodiment of an aluminum bonding member and a method for producing the same according to the present invention will be described below.

As shown in FIG. 1, an aluminum bonding member 10 in this preferred embodiment comprises an aluminum member 12 having a substantially rectangular planar shape, and a substantially U-shaped tubular member 14 having a substantially annular sectional shape. Both of the opening end portions of the tubular member 14 protrude from the aluminum member 12 to be open to the outside. A portion of the tubular member 14 between the opening end portions is arranged in the aluminum member 12 to contact the aluminum member 12 to be bonded directly thereto. As an example of the tubular member 14, a stainless pipe having a diameter of about 10 mm may be used. Alternatively, a pipe of a metal, such as molybdenum (Mo) or copper (Cu), or a pipe of a ceramic, such as alumina or zirconia, may be used if it is made of a material which is difficult to melt during the injection of molten aluminum which will be described later. Furthermore, if the aluminum bonding member 10 is used as a cooling member, a gaseous or liquid cooling medium flows through the tubular member 14 to cool the aluminum member 10. Therefore, it is always required that the tubular member 14 is substantially U-shaped, and the tubular member 14 may have any one of such shapes that the tubular member 14 extends in a wide region of the aluminum bonding member 10.

Such an aluminum bonding member 10 may be produced by using, e.g., a die 20 shown in FIGS. 2 and 3. The die 20 is formed of a material, such as carbon, which is capable of being easily and inexpensively formed. As shown in FIGS. 2 and 3, the die 20 comprises a lower die member 22, an upper die member 24 and a lid member 26.

The lower die member 22 comprises a plate-shaped bottom portion 22a having a substantially rectangular planar shape, and a side wall portion 22b extending from the peripheral portion of the bottom portion 22b vertically upwards. The top face of the side wall portion 22b has two substantially semi-circular recessed portions 22c corresponding to the lower half of the tubular member 14.

The upper die member 24 has such a shape that the side wall portion 22b of the lower die member 22 is extended vertically upwards when the upper die member 24 is arranged on the lower die member 22. The bottom face of the upper die member 24 has two substantially semi-circular recessed portions 24a corresponding to the upper half of the tubular member 14. When the upper die member 24 is arranged on the lower die member 22, the two recessed portions 24a face the two recessed portion 22c of the lower die member 22 to form substantially circular through holes 28 for allowing the tubular member 14 to pass therethrough.

The lid member 26 is a member for closing the substantially rectangular upper opening portion of the upper die member 24, and has a substantially rectangular planar shape which corresponds to that of the lower die member 22 and upper die member 24. In one corner portion of the lid member 26, an inlet 26a for injecting molten aluminum into the die 20 is formed. In a corner portion of the lid member 26 facing the corner portion having the inlet 26a, a vent hole 26b for discharging gases from the die 20 is formed.

If the lid member 26 is arranged on the upper die member 24 after the upper die member 24 is arranged on the lower die member 22, a space having a shape corresponding to the aluminum member 12 is formed in the die 20. Furthermore, the lid member 26 may be integrated with the upper die member 24. It is not always required that the inlet 26a and the vent hole 26b are formed in the lid member 26, and they may be suitably formed in other portions by design.

A method for producing the aluminum bonding member 10 using the die 20 with the above described construction will be described below.

First, the substantially U-shaped tubular member 14 is put in the lower die member 22 so that the opening end portions of the tubular member 14 protrude to the outside of the die 20 via the through holes 28, and then, the upper die member 24 is arranged on the lower die member 22 to be fixed thereto.

Then, the upper opening portion of the upper die member 24 is closed by the lid member 26 to be fixed thereto. Thereafter, the die 20 is put in a nitrogen atmosphere furnace having an oxygen concentration of 100 ppm or less to be heated to 750, and molten aluminum having a purity of 99.99% heated to the same temperature as that of the die 20 to be melted is injected into the die 20 from the inlet 26a by means of a carbon cylinder. Since the lid member 26 has the vent hole 26b, the molten aluminum can be injected without applying a high pressure. Finally, the molten aluminum is injected into in the die 20 to such an extent that the molten aluminum overflows via the vent hole 26b, so that the molten aluminum is filled in the die 20.

Then, the die 20 is cooled to solidify aluminum to bond a solid aluminum member to the tubular member 14, and then, cooled to a room temperature. The aluminum bonding member 10 thus obtained is taken out of the die 20. Thereafter, portions of the aluminum bonding member 10 corresponding to the inlet 26a and vent hole 26b are removed by cutting work or the like to flatten the surface of the aluminum bonding member 10.

If the aluminum bonding member 10 thus obtained is caused to adhere to a metal/ceramic circuit board via a radiating grease and if a cooling medium is caused to flow through the tubular member 14, the aluminum bonding member 10 can be used as a cooling member for the metal/ceramic circuit board. In addition, if a predetermined portion of the aluminum bonding member 10 is plated with an Ni—P alloy and if a metal/ceramic circuit board is soldered on the plated portion, it is possible to obtain a more excellent and stable cooling power than that of an air cooling fin.

Second Preferred Embodiment

Figure 4:
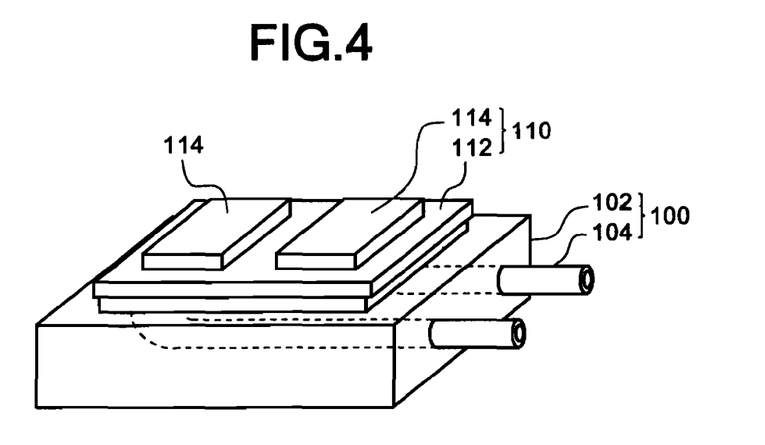
FIG. 4 is a perspective view of an aluminum bonding member wherein a copper/ceramic circuit board is bonded directly thereto, as the second preferred embodiment of an aluminum bonding member according to the present invention.
Figure 5:
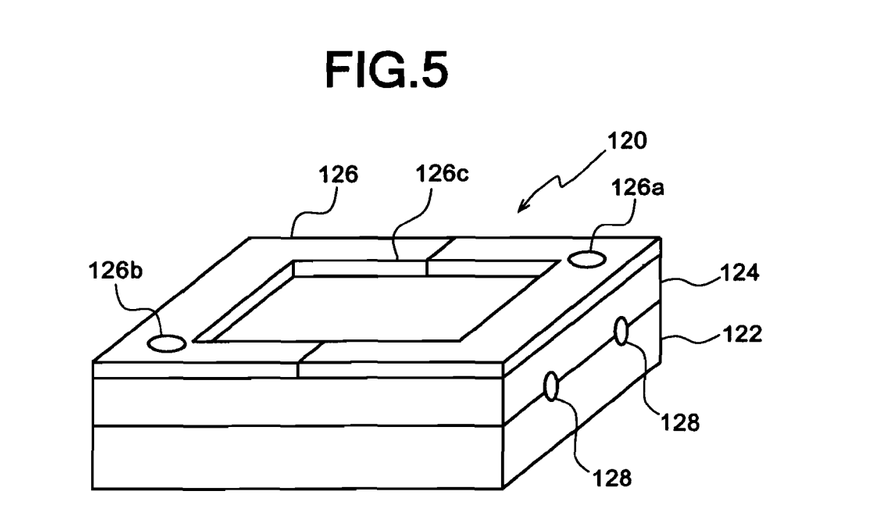
FIG. 5 is a perspective view of a die used for producing the aluminum bonding member of FIG. 4.
Figure 6:
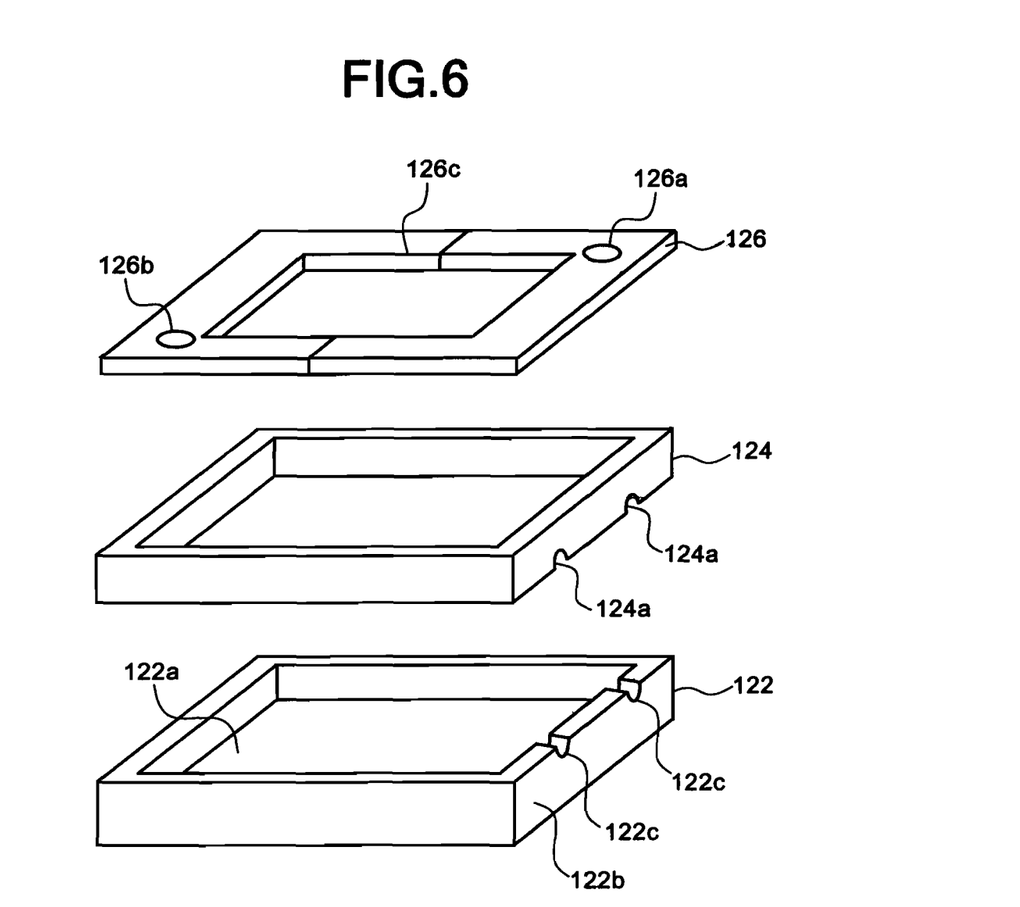
FIG. 6 is an exploded perspective view of the die of FIG. 5.

Referring to FIGS. 4 through 6, as the second preferred embodiment of an aluminum bonding member and a method for producing the same according to the present invention, an embodiment wherein the same aluminum bonding member as the aluminum bonding member 10 in the first preferred embodiment is bonded directly to a copper/ceramic circuit board will be described below.

As shown in FIG. 4, similar to the first preferred embodiment, an aluminum bonding member 100 in this preferred embodiment comprises an aluminum member 102 having a substantially rectangular planar shape, and a substantially U-shaped tubular member 104 having a substantially annular sectional shape. Both of the opening end portions of the tubular member 104 protrude from the aluminum member 102 to be open to the outside. A portion of the tubular member 104 between the opening end portions is arranged in the aluminum member 102 to contact the aluminum member 102 to be bonded directly thereto.

The aluminum bonding member 100 may be used as a cooling member for a copper/ceramic circuit board 110 wherein a copper circuit plate 114 is bonded to one side of a ceramic substrate 112, if it is bonded directly to the other side of the ceramic substrate 112 of the copper/ceramic circuit board 110. Furthermore, the bonding of the ceramic substrate 112 to the copper circuit plate 114 of the copper/ceramic circuit board 110 may be carried out by any one of direct bonding and brazing methods, if the bonding portion of the ceramic substrate 112 to the copper circuit plate 114 does not melt during the bonding using molten aluminum.

Such an aluminum bonding member 100 bonded directly to the copper/ceramic circuit board 110 may be produced by using, e.g., a die 120 shown in FIGS. 5 and 6. The die 120 is formed of a material, such as carbon, which is capable of being easily and inexpensively formed. As shown in FIGS. 5 and 6, the die 120 comprises a lower die member 122, an upper die member 124 and a lid member 126.

The lower die member 122 comprises a plate-shaped bottom portion 122a having a substantially rectangular planar shape, and a side wall portion 122b extending from the peripheral portion of the bottom portion 122b vertically upwards. The top face of the side wall portion 122b has two substantially semi-circular recessed portions 122c corresponding to the lower half of the tubular member 104.

The upper die member 124 has such a shape that the side wall portion 122b of the lower die member 122 is extended vertically upwards when the upper die member 124 is arranged on the lower die member 122. The bottom face of the upper die member 124 has two substantially semi-circular recessed portions 124a corresponding to the upper half of the tubular member 104. When the upper die member 124 is arranged on the lower die member 122, the two recessed portions 124a face the two recessed portion 122c of the lower die member 122 to form two substantially circular through holes 128 for allowing the tubular member 104 to pass therethrough.

The lid member 126 is a member for closing a portion near the peripheral portion of the substantially rectangular upper opening portion of the upper die member 124, and has a substantially rectangular planar shape which corresponds to that of the lower die member 122 and upper die member 124.

In one corner portion of the lid member 126, an inlet 126a for injecting molten aluminum into the die 120 is formed. In a corner portion of the lid member 126 facing the corner portion having the inlet 126a, a vent hole 126b for discharging gases from the die 120 is formed. In addition, a substantially central portion of the lid member 126 has a substantially Rectangular opening portion 126c which is slightly smaller than the ceramic substrate 112. Since the opening portion 126c is thus smaller than the ceramic substrate 112, the lid member 126 is formed by combining two separate pieces so that the aluminum bonding member 100 can be easily taken out of the die 120 after the copper/ceramic circuit board 110 is bonded thereto.

If the lid member 126 is arranged on the upper die member 124 after the upper die member 124 is arranged on the lower die member 122, a space having a shape corresponding to the aluminum member 102 is formed in the die 120. Furthermore, it is not always required that the inlet 126a and the vent hole 126b are formed in the lid member 126, and they may be suitably formed in other portions by design.

A method for producing the aluminum bonding member 100 using the die 120 with the above described construction will be described below.

First, the substantially U-shaped tubular member 104 is put in the lower die member 122 so that the opening end portions of the tubular member 104 protrude to the outside of the die 120 via the through holes 128, and then, the upper die member 124 is arranged on the lower die member 122 to be fixed thereto.

Then, the lid member 126 is arranged on the upper die member 124 to close a portion near the peripheral portion of the upper opening portion of the upper die member 124. Thereafter, the copper/ceramic circuit board 110 is arranged on and fixed to the lid member 126 so as to close the opening portion 126C of the lid member 126.

Then, the die 120 is put in a nitrogen atmosphere furnace having an oxygen concentration of 100 ppm or less to be heated to 750, and molten aluminum having a purity of 99.99% heated to the same temperature as that of the die 120 to be melted is injected into the die 120 from the inlet 126a by means of a carbon cylinder. Since the lid member 126 has the vent hole 126b, the molten aluminum can be injected without applying a high pressure. Finally, the molten aluminum is injected into the die 120 to such an extent that the molten aluminum overflows via the vent hole 126b, so that the molten aluminum is filled in the die 120.

Then, the die 120 is cooled to solidify aluminum to bond a solid aluminum member to the tubular member 104 and copper/ceramic circuit board 110, and then, cooled to a room temperature. The aluminum bonding member 100 thus obtained is taken out of the die 120. Furthermore, since the lid member 126 comprises two pieces capable of being separated from each other, the aluminum bonding member 100 can be easily taken out of the die 120. Thereafter, portions of the aluminum bonding member 100 corresponding to the inlet 126a and vent hole 126b are removed by cutting work or the like to flatten the surface of the aluminum bonding member 100.

In this preferred embodiment, the aluminum bonding member can be simply integrated with the copper/ceramic circuit board without using any solders and radiating greases, so that it is possible to produce a copper/ceramic circuit board with an inexpensive cooling system having good characteristics.

In this preferred embodiment, molten aluminum is caused to contact the die in an atmosphere of an inert gas, such as nitrogen gas. In addition, the bonding of the aluminum member 102 to the tubular member 104 is chemically carried out while removing oxide films from the surface of molten aluminum. Moreover, the bonding of the aluminum member 102 to the ceramic substrate 112 is also chemically carried out. Therefore, it is possible to carry out the bonding using commercially available materials without utilizing the anchor effect which is obtained by forming irregularities on the surface for the bonding.

In this preferred embodiment, if special measures, such as measures to cool the circuit plate so as to prevent the circuit plate from melting during the injection of molten aluminum, are taken, an aluminum/ceramic circuit board may be substituted for the copper/ceramic circuit board 110. The ceramic substrate 112 preferably contains alumina, aluminum nitride, silicon nitride or silicon carbide as a main component.

Third Preferred Embodiment

Referring to FIGS. 7 through 10, as the third preferred embodiment of an aluminum bonding member and a method for producing the same according to the present invention, an embodiment wherein the same aluminum bonding member as the aluminum bonding member 10 in the first preferred embodiment is bonded directly to an aluminum/ceramic circuit board will be described below.

Figure 7:
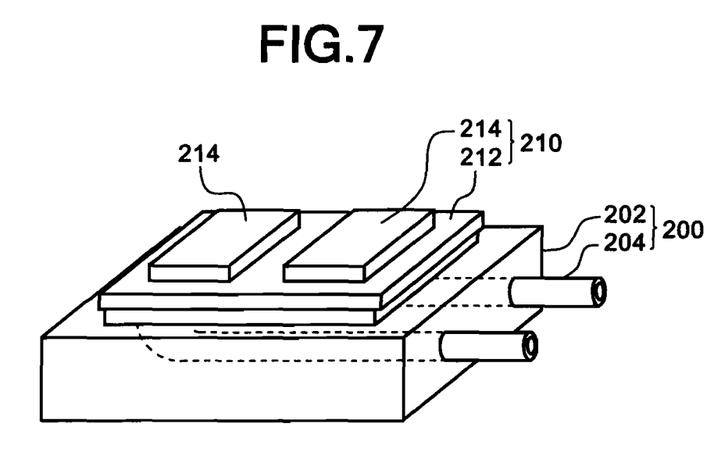
FIG. 7 is a perspective view of an aluminum bonding member wherein an aluminum/ceramic circuit board is bonded directly thereto, as the third preferred embodiment of an aluminum bonding member according to the present invention.

As shown in FIG. 7, similar to the first preferred embodiment, an aluminum bonding member 200 in this preferred embodiment comprises an aluminum member 202 having a substantially rectangular planar shape, and a substantially U-shaped tubular member 204 having a substantially annular sectional shape. Both of the opening end portions of the tubular member 204 protrude from the aluminum member 202 to be open to the outside. A portion of the tubular member 204 between the opening end portions is arranged in the aluminum member 202 to contact the aluminum member 202 to be bonded directly thereto.

The aluminum bonding member 200 may be used as a cooling member for an aluminum/ceramic circuit board 210 wherein an aluminum circuit plate 214 is bonded to one side of a ceramic substrate 212, if it is bonded directly to the other side of the ceramic substrate 212 of the aluminum/ceramic circuit board 210.

Figure 8:
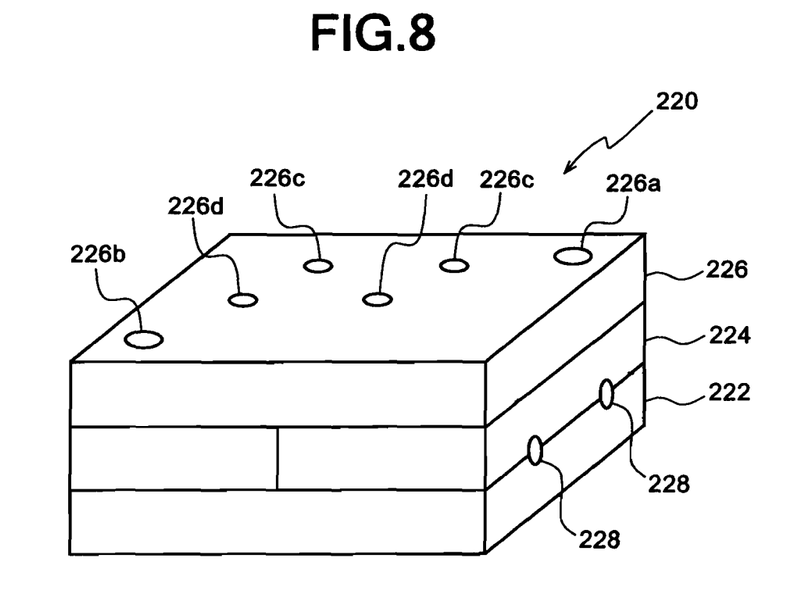
FIG. 8 is a perspective view of a die used for producing the aluminum bonding member of FIG. 7.
Figure 9:
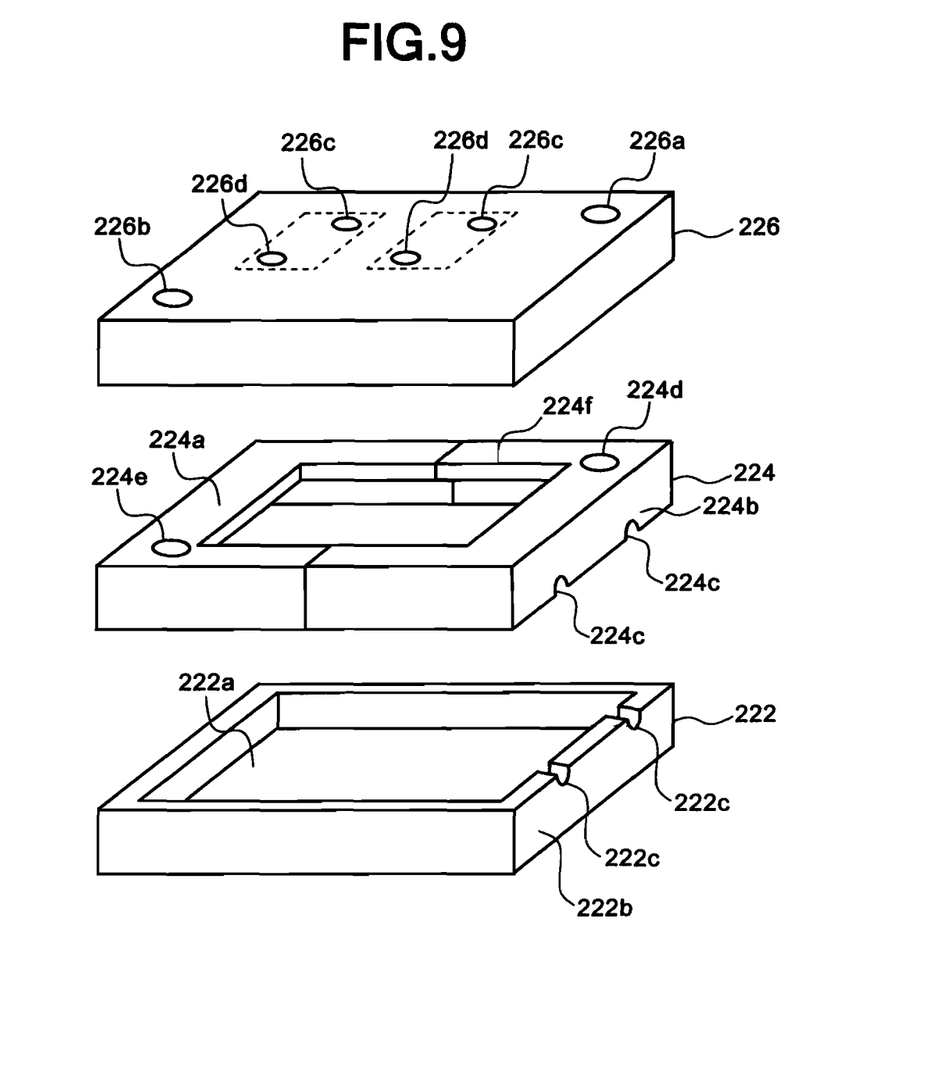
FIG. 9 is an exploded perspective view of the die of FIG. 8, wherein dotted lines show aluminum circuit plate forming portions formed in the bottom of a lid member.
Figure 10:
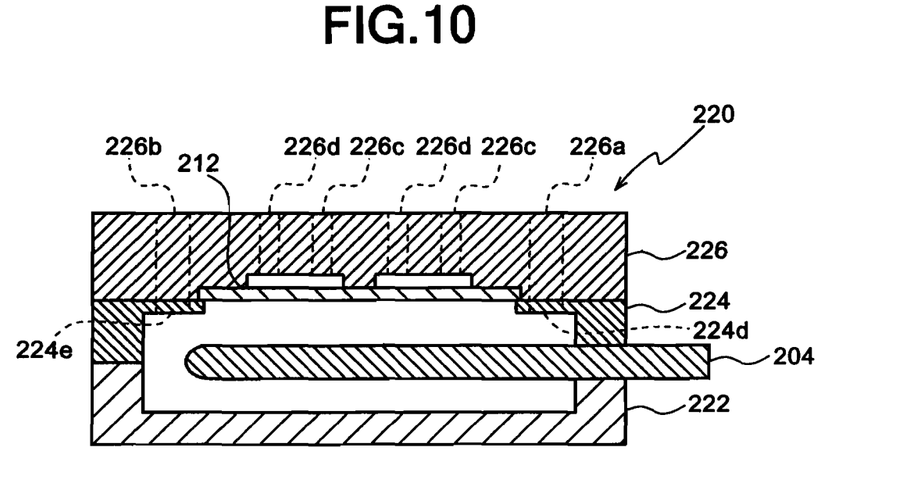
FIG. 10 is a sectional view of the die of FIG. 8, which shows a state that a tubular member and a ceramic substrate are put in a die, and wherein dotted lines show inlets and passages for injecting molten aluminum and vent holes and passages for discharging gases.

Such an aluminum bonding member 200 bonded directly to the aluminum/ceramic circuit board 210 may be produced by using, e.g., a die 220 shown in FIGS. 8 through 10. In this preferred embodiment, unlike the second preferred embodiment wherein the copper/ceramic circuit board 110 comprising the ceramic substrate 112 and the copper circuit plate 114 previously bonded thereto is bonded to the aluminum bonding member 100, the bonding of the aluminum circuit plate 214 to the ceramic substrate 212 is carried out simultaneously with the bonding of the aluminum bonding member 210, since the material of the circuit plate is aluminum and since the aluminum circuit plate 214 melts during the injection of molten aluminum unless special measures, such as measures to cool the aluminum circuit plate 214, are taken if the aluminum/ceramic circuit board 210 is bonded to the aluminum bonding member 200 after the aluminum circuit plate 214 is previously bonded to the ceramic substrate 212 by the same method as that in the second preferred embodiment.

The die 220 is formed of a material, such as carbon, which is capable of being easily and inexpensively formed. As shown in FIGS. 8 through 10, the die 220 comprises a lower die member 222, an upper die member 224 and a lid member 226.

The lower die member 222 comprises a plate-shaped bottom portion 222a having a substantially rectangular planar shape, and a side wall portion 222b extending from the peripheral portion of the bottom portion 222b vertically upwards. The top face of the side wall portion 222b has two substantially semi-circular recessed portions 222c corresponding to the lower half of the tubular member 204.

The upper die member 224 comprises a substantially rectangular plate-shaped top portion 224a having the same planar shape and size as those of the lower die member 222, and a side wall portion 224b which extends from the peripheral portion of the top portion 224b vertically downwards and which has such a shape that the side wall portion 222b of the lower die member 222 is extended vertically upwards when the upper die member 224 is arranged on the lower die member 222. The bottom face of the side wall portion 224b of the upper die member 224 has two substantially semi-circular recessed portions 224c corresponding to the upper half of the tubular member 204. When the upper die member 224 is arranged on the lower die member 222, the two recessed portions 224c face the two recessed portion 222c of the lower die member 222 to form two substantially circular through holes 228 for allowing the tubular member 204 to pass therethrough. In one corner portion of the top portion 224a of the upper die member 224, there is formed a passage 224d for injecting molten aluminum into a space defined by the lower die member 222 and the upper die member 224. In a corner portion of the top portion 224a of the upper die member 224 facing the corner portion having the passage 224d, there is formed a passage 224e for discharging gases from the space defined by the lower die member 222 and the upper die member 224. Moreover, a substantially central portion of the top portion 224a of the upper die member 224 has a substantially rectangular opening portion 224f which is slightly smaller than the ceramic substrate 212. Since the opening portion 224f is thus smaller than the ceramic substrate 212, the upper die member 224 is formed by combining two separate pieces so that the aluminum bonding member 200 can be easily taken out of the die 220 after the aluminum/ceramic circuit board 210 is bonded thereto.

The lid member 226 is a substantially rectangular member having the same planar shape and size as those of the upper die member 224. As shown in FIG. 10, in a substantially central portion of the bottom face of the lid member 226, a recessed portion, which substantially has the same shape as that of the ceramic substrate 212 and which is slightly greater than the ceramic substrate 212, is formed as a ceramic substrate housing portion. In the bottom face (the upper face in FIG. 10) of the ceramic substrate housing portion, two recessed portions, each of which substantially has the same shape and size as those of the aluminum circuit plates 214, are formed as aluminum circuit plate forming portions for forming the aluminum circuit plates 214 on the top face of the ceramic substrate 212. In addition, as shown in FIGS. 8 through 10, in one corner portion of the top portion of the lid member 226, there is formed an inlet 226a which is communicated with the passage 224d of the upper die member 224 for injecting molten aluminum into the space defined by the lower die member 222 and the upper die member 224. In a corner portion of the top portion of the lid member 226 facing the corner portion having the inlet 226a, there is formed a vent hole 226b which is communicated with the passage 224e of the upper die member 224 for discharging gases from the space defined by the lower die member 222 and the upper die member 224. Moreover, the lid member 226 has inlets 226c for injecting molten aluminum into each of the aluminum circuit plate forming portions, and vent holes 226d for discharging gases from each of the aluminum circuit plate forming portions.

A method for producing the aluminum bonding member 200 using the die 220 with the above described construction will be described below.

First, the substantially U-shaped tubular member 204 is put in the lower die member 222 so that the opening end portions of the tubular member 204 protrude to the outside of the die 220 via the through holes 228, and then, the upper die member 224 is arranged on the lower die member 222 to be fixed thereto.

Then, the ceramic substrate 212 is arranged on the upper die member 224 so as to close the opening portion 224f of the upper die member 224, and then, the lid member 226 is arranged on the upper die member 224 to be fixed thereto.

Then, the die 220 is put in a nitrogen atmosphere furnace having an oxygen concentration of 100 ppm or less to be heated to 750° C., and molten aluminum having a purity of 99.99% heated to the same temperature as that of the die 220 to be melted is injected into the die 220 from the inlets 226a and 226c by means of a carbon cylinder. Since the lid member 226 has the vent holes 226b and 226d, the molten aluminum can be injected without applying a high pressure. Finally, the molten aluminum is injected into in the die 220 to such an extent that the molten aluminum overflows via the vent holes 226b and 226d, so that the molten aluminum is filled in the die 220.

Then, the die 220 is cooled to solidify aluminum to bond a solid aluminum member to the tubular member 204 and ceramic substrate 212, and then, cooled to a room temperature. The aluminum bonding member 200 thus obtained is taken out of the die 220. Furthermore, since the upper die member 224 comprises two pieces capable of being separated from each other, the aluminum bonding member 200 can be easily taken out of the die 220. Thereafter, portions of the aluminum bonding member 200 corresponding to the inlets 226a, 226c and vent holes 226b, 226d are removed by cutting work or the like to flatten the surface of the aluminum bonding member 200.

As described above, in this preferred embodiment, it is possible to simply produce an aluminum/ceramic circuit board with a cooling member if only molten aluminum is injected into the die 220 after the ceramic substrate 212 is put in the die 220. If a circuit plate having a complicated shape is formed, a precise pattern can be formed by a method, such as etching, after the aluminum circuit plate is bonded.

Furthermore, the metal to be filled in the die is preferably aluminum or an aluminum alloy which more preferably has a Vickers hardness of 40 or less in order to reduce stress caused by a difference in thermal expansion between the ceramic and the metal. If the Vickers hardness of the metal exceeds 40, there are some cases where cracks may be produced in the ceramic substrate during the bonding and/or during heat cycles applied thereto.

Figure 11:
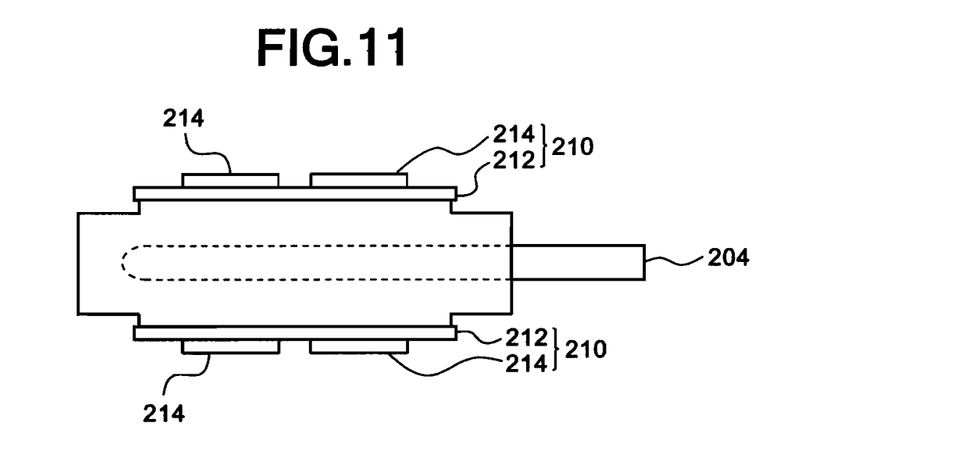
FIG. 11 is a side view of an aluminum bonding member wherein aluminum/ceramic circuit boards are bonded directly to both sides thereof, as a modified example of the third preferred embodiment of an aluminum bonding member according to the present invention.
Figure 12:
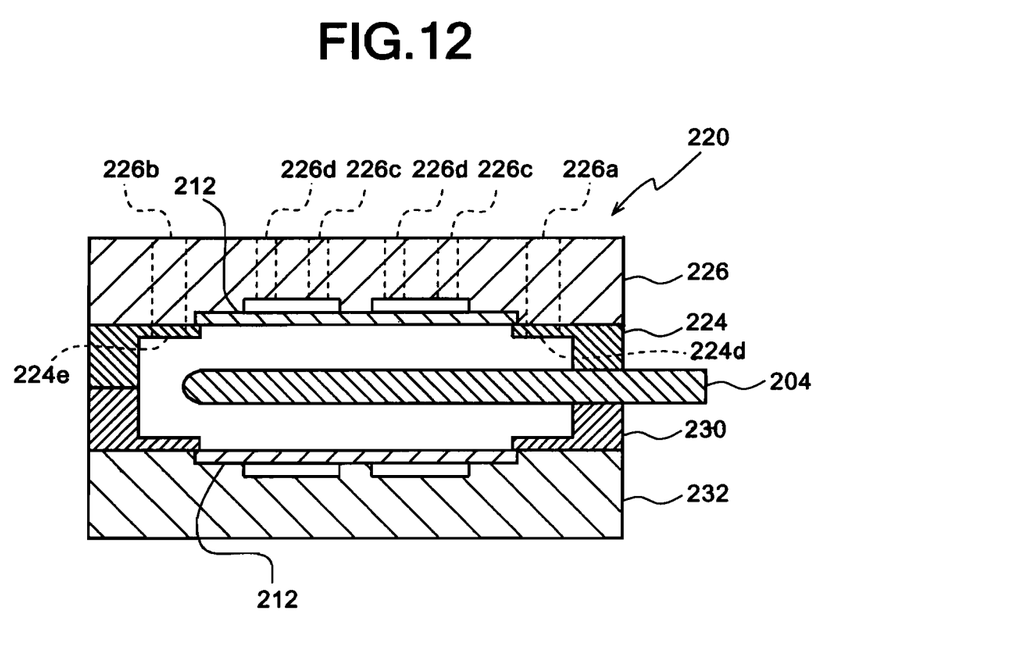
FIG. 12 is a sectional view of a die used for producing the aluminum bonding member of FIG. 11.

In this preferred embodiment, as shown in FIG. 11, the aluminum/ceramic circuit boards 210 may be bonded directly to both sides of the aluminum bonding member 200. Such an aluminum bonding member 200 having the aluminum/ceramic circuit boards 210 bonded directly to both sides thereof may be produced by using a lower die member 230 and a bottom die member 232 as shown in FIG. 12 in place of the lower die member 222 of FIG. 10. In this case, molten aluminum injected into the die is designed to pass through a space (not shown), which is defined between the bottom die member 232 and the ceramic substrate 212 arranged therein, to bond the aluminum circuit boards 214 directly to the opposite surface of the ceramic substrate 212. If the aluminum/ceramic circuit boards 210 are thus bonded to both sides of the aluminum bonding member 200, the size of a power module can be compact.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing an aluminum bonding member, said method comprising the steps of:

preparing a tubular member of a material which does not melt at a temperature close to a melting point of aluminum or an aluminum alloy;

putting said tubular member in a die so that opening end portions of the tubular member are open to the outside of the die;

arranging a metal/ceramic circuit board, which has a metal circuit plate bonded to a ceramic substrate, on the die so as to close an opening portion formed in a top face of the die;

injecting a molten metal of aluminum or the aluminum alloy into said die; and cooling and solidifying the injected molten metal to cause a portion of said tubular member in said die to contact a solid aluminum member to be bonded thereto while causing the metal/ceramic circuit board to contact the solid aluminum member to be bonded thereto.

2. A method for producing an aluminum bonding member, said method comprising the steps of:

preparing a tubular member of a material which does not melt at a temperature close to a melting point of aluminum or an aluminum alloy;

putting said tubular member in a die so that opening end portions of the tubular member are open to the outside of the die;

arranging a ceramic substrate on said die so as to close an opening portion formed in a top face of the die;

arranging a lid member on said die so as to surround said ceramic substrate on said die;

injecting a molten metal of aluminum or the aluminum alloy into said die and a space defined by said lid member and said ceramic substrate; and cooling and solidifying the injected molten metal to form a solid aluminum member on one side of said ceramic substrate while forming an aluminum circuit plate on the other side of said ceramic substrate, wherein a portion of the tubular member in said die is caused to contact said solid aluminum member to be bonded thereto when said injected molten metal is cooled and solidified.

3. A method for producing an aluminum bonding member as set forth in claim 2, wherein the whole portion of said tubular member arranged in said die is caused to contact said solid aluminum member to be bonded thereto when said injected molten metal is cooled and solidified.

4. A method for producing an aluminum bonding member as set forth in claim 3, wherein said solid aluminum member is caused to contact to said one side of said ceramic substrate to be bonded thereto when said injected molten metal is cooled and solidified.

5. A method for producing an aluminum bonding member as set forth in claim 4, wherein said aluminum circuit plate is caused to contact said other side of said ceramic substrate to be bonded thereto when said injected molten metal is cooled and solidified.

* * * * *